United States Patent
Fujimoto

(10) Patent No.: US 10,895,849 B2
(45) Date of Patent: Jan. 19, 2021

(54) TIME-TO-DIGITAL CONVERSION CIRCUIT

(71) Applicant: SHARP KABUSHIKI KAISHA, Sakai (JP)

(72) Inventor: Yoshihisa Fujimoto, Sakai (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

(21) Appl. No.: 16/872,300

(22) Filed: May 11, 2020

(65) Prior Publication Data

US 2020/0363774 A1 Nov. 19, 2020

Related U.S. Application Data

(60) Provisional application No. 62/847,271, filed on May 13, 2019.

(51) Int. Cl.
*H03M 1/50* (2006.01)
*G04F 10/00* (2006.01)

(52) U.S. Cl.
CPC .................. *G04F 10/005* (2013.01)

(58) Field of Classification Search
CPC ......... G04F 10/005; H03M 1/12; H03M 1/00; H03M 1/66
USPC .......................................... 341/166, 155, 144
See application file for complete search history.

(56) References Cited

U.S. PATENT DOCUMENTS

| | | | | |
|---|---|---|---|---|
| 6,246,737 B1 * | 6/2001 | Kuglin | ................... | G04F 10/04 331/45 |
| 8,022,849 B2 * | 9/2011 | Zhang | .................. | H03L 7/1976 341/142 |
| 9,041,443 B2 * | 5/2015 | Jang | ........................ | H03L 7/193 327/156 |
| 9,106,253 B2 * | 8/2015 | Hagihara | ............ | H03M 1/0624 |
| 10,503,122 B2 * | 12/2019 | Testi | ........................ | G04F 10/06 |
| 10,534,322 B2 * | 1/2020 | Chu | ........................ | H01J 49/40 |
| 10,579,021 B2 * | 3/2020 | Salle | ........................ | H03M 1/50 |
| 10,623,010 B2 * | 4/2020 | Loke | ........................ | H03M 1/183 |
| 10,725,433 B2 * | 7/2020 | Fujimoto | ................ | H03L 7/085 |
| 2014/0077065 A1 * | 3/2014 | Hagihara | ................ | H03M 1/34 250/208.1 |

(Continued)

OTHER PUBLICATIONS

Shingo et al., "A 780×800 μm² Multichannel Digital Silicon Photomultiplier With Column-Parallel Time-to-Digital Converter and Basic Characterization", IEEE Transactions on Nuclear Science, Vol. 61, No. 1, Feb. 2014, pp. 44-52.

(Continued)

*Primary Examiner* — Jean B Jeanglaude
(74) *Attorney, Agent, or Firm* — ScienBiziP, P.C.

(57) ABSTRACT

A time-to-digital conversion circuit includes; an oscillator circuit that outputs a plurality of phase signals different from each other, a counter that counts a number of edges of at least one phase signal among the plurality of phase signals and outputs a count signal, a phase sampling circuit that samples the value of each of the plurality of phase signals at a stop time point and outputs a stop phase signal, a start phase signal generating circuit that outputs a start phase signal, and an output circuit that, based on the count signal, the stop phase signal, and the start phase signal, generates an output signal, the output signal being a digital signal indicating a time period from a start time point to a stop time point.

3 Claims, 11 Drawing Sheets

(56) References Cited

U.S. PATENT DOCUMENTS

| | | | |
|---|---|---|---|
| 2014/0266341 A1* | 9/2014 | Jang | H03L 7/085 327/156 |
| 2015/0077279 A1 | 3/2015 | Song et al. | |
| 2019/0187628 A1* | 6/2019 | Chu | H01J 49/0036 |
| 2019/0243312 A1* | 8/2019 | Chu | H03K 21/38 |

OTHER PUBLICATIONS

Niclass et al., "A 100-m Range 10-Frame/s 340×96-Pixel Time-of-Flight Depth Sensor in 0.18-μm CMOS", IEEE Journal of Solid-State Circuits, vol. 48, No. 2, Feb. 2013, pp. 559-572.

\* cited by examiner

FIG.1

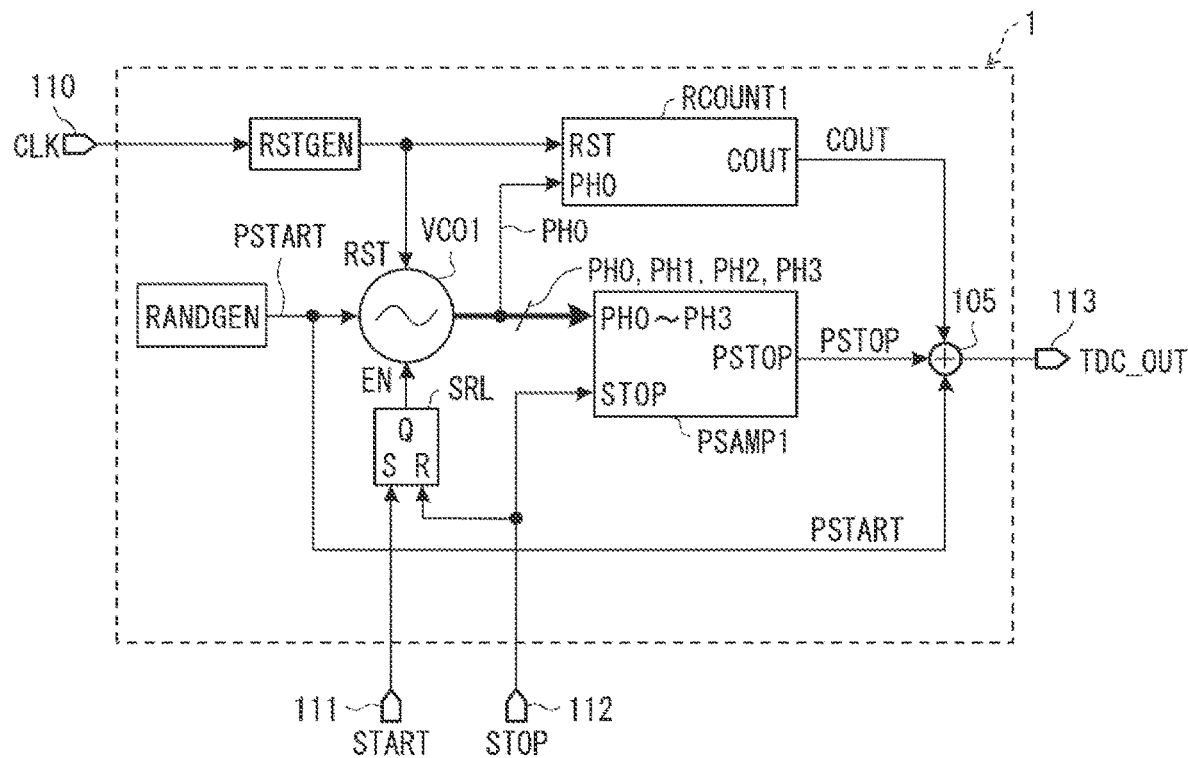

1: TDC CIRCUIT
105: OUTPUT CIRCUIT
110, 111, 112: INPUT TERMINAL
113: OUTPUT TERMINAL
COUT: COUNT SIGNAL
EN: ENABLE SIGNAL
PH0~PH3: PHASE SIGNAL
PSAMP1: PHASE SAMPLING CIRCUIT
PSTART: START PHASE SIGNAL
PSTOP: SAMPLING SIGNAL (STOP PHASE SIGNAL)
RANDGEN: RANDOM SIGNAL GENERATING CIRCUIT
RCOUNT1: RIPPLE COUNTER
RST: RESET SIGNAL
RSTGEN: RESET SIGNAL GENERATING CIRCUIT
SRL: SR LATCH
START: START SIGNAL
STOP: STOP SIGNAL
TDC_OUT: OUTPUT SIGNAL
VCO1: OSCILLATOR CIRCUIT 121, 122, 123: INPUT TERMINAL
AN1: AND GATE
DEL0~DEL3: DELAY CIRCUIT
INV0, INV2: INVERTER
PH0~PH3: PHASE SIGNAL
SW4~SW7: SWITCH
TOG4~TOG7: TOGGLE SWITCH
VCO1: OSCILLATOR CIRCUIT
VDD: POWER SUPPLY VOLTAGE

| PSTART | PH0 | PH1 | PH2 | PH3 | PHASE |
|---|---|---|---|---|---|
| 0 | 1 | 0 | 0 | 0 | 0 |
| 1 | 1 | 1 | 0 | 0 | 1 |
| 2 | 1 | 1 | 1 | 0 | 2 |
| 3 | 1 | 1 | 1 | 1 | 3 |
| 4 | 0 | 1 | 1 | 1 | 4 |
| 5 | 0 | 0 | 1 | 1 | 5 |
| 6 | 0 | 0 | 0 | 1 | 6 |
| 7 | 0 | 0 | 0 | 0 | 7 |

112, 190, 191, 192, 193: INPUT TERMINAL
194: OUTPUT TERMINAL
DEC: DECODER
FF10~FF13: FLIP-FLOP
PSAMP1: PHASE SAMPLING CIRCUIT

TB11

| P0 | P1 | P2 | P3 | PSTOP |
|----|----|----|----|-------|
| 1  | 0  | 0  | 0  | 0     |
| 1  | 1  | 0  | 0  | 1     |
| 1  | 1  | 1  | 0  | 2     |
| 1  | 1  | 1  | 1  | 3     |
| 0  | 1  | 1  | 1  | 4     |
| 0  | 0  | 1  | 1  | 5     |
| 0  | 0  | 0  | 1  | 6     |
| 0  | 0  | 0  | 0  | 7     |

FIG.7

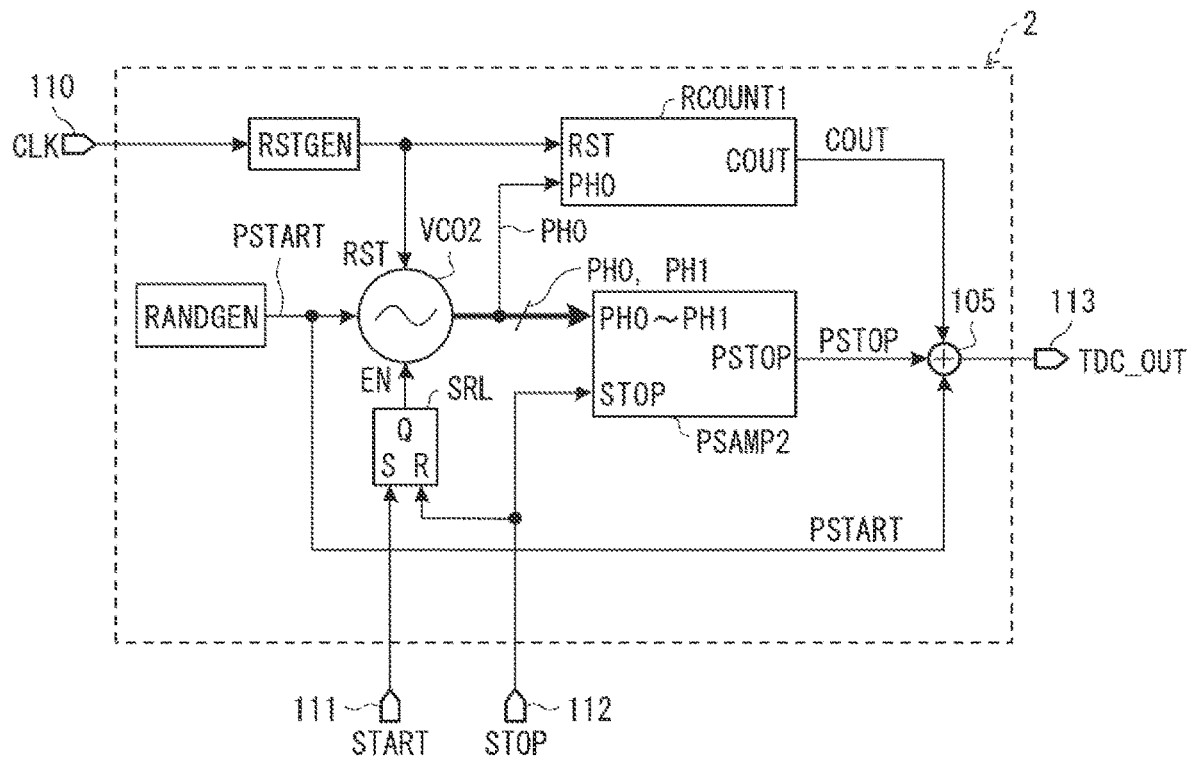

2: TDC CIRCUIT
105: OUTPUT CIRCUIT
110, 111, 112: INPUT TERMINAL
113: OUTPUT TERMINAL
COUT: COUNT SIGNAL
EN: ENABLE SIGNAL
PH0~PH1: PHASE SIGNAL
PSAMP2: PHASE SAMPLING CIRCUIT
PSTART: START PHASE SIGNAL
PSTOP: SAMPLING SIGNAL (STOP PHASE SIGNAL)
RANDGEN: RANDOM SIGNAL GENERATING CIRCUIT
RCOUNT1: RIPPLE COUNTER
RST: RESET SIGNAL
RSTGEN: RESET SIGNAL GENERATING CIRCUIT
SRL: SR LATCH
START: START SIGNAL
STOP: STOP SIGNAL
TDC_OUT: OUTPUT SIGNAL
VCO2: OSCILLATOR CIRCUIT

| PSTART | PH0 | PH1 | PHASE |
|---|---|---|---|
| 0 | 0.5 | 0 | 0 |
| 1 | 1 | 0 | 1 |
| 2 | 1 | 0.5 | 2 |
| 3 | 1 | 1 | 3 |
| 4 | 0.5 | 1 | 4 |
| 5 | 0 | 1 | 5 |
| 6 | 0 | 0.5 | 6 |
| 7 | 0 | 0 | 7 |

112, 190, 191: INPUT TERMINAL
194: OUTPUT TERMINAL
CP00~CP11: COMPARATOR
DEC: DECODER
FF20~FF23: FLIP-FLOP
PSAMP2: PHASE SAMPLING CIRCUIT

| Q0 | Q1 | Q2 | Q3 | PSTOP |
|----|----|----|----|-------|
| 1  | 0  | 0  | 0  | 0     |
| 1  | 1  | 0  | 0  | 1     |
| 1  | 1  | 1  | 0  | 2     |
| 1  | 1  | 1  | 1  | 3     |
| 1  | 0  | 1  | 1  | 4     |
| 0  | 0  | 1  | 1  | 5     |
| 0  | 0  | 1  | 0  | 6     |
| 0  | 0  | 0  | 0  | 7     |

FIG.12

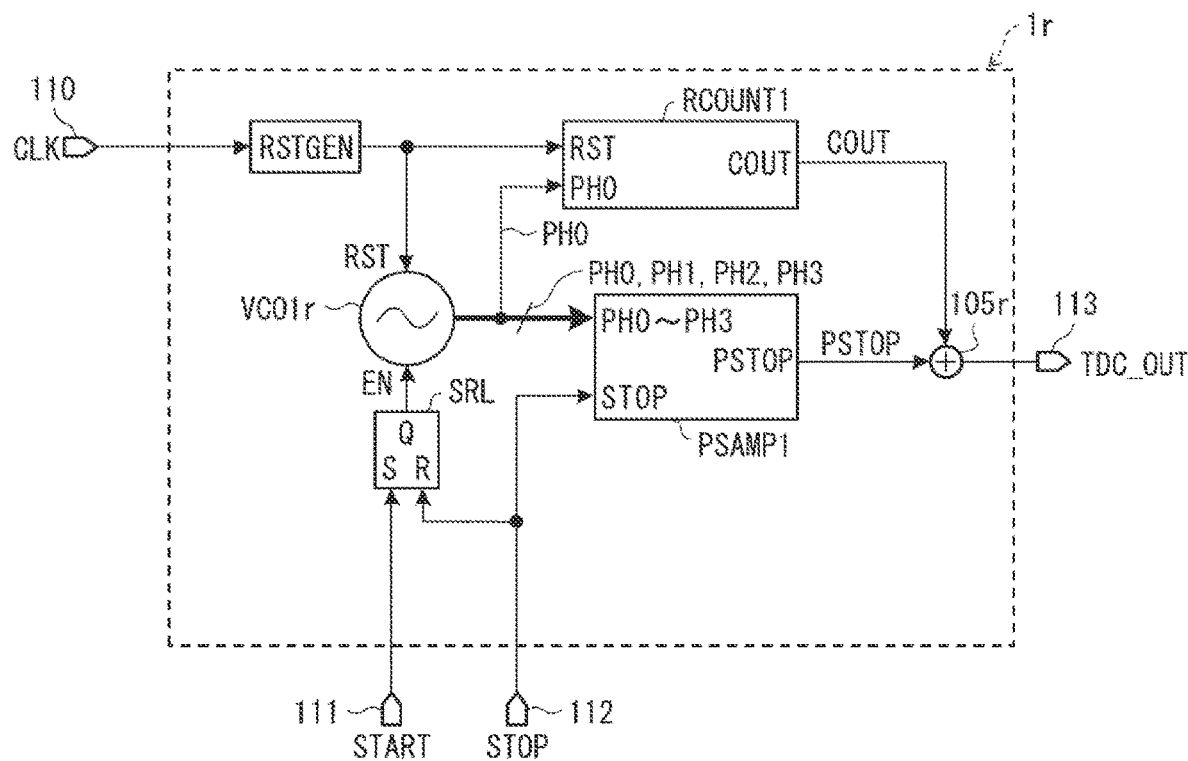

1r: TDC CIRCUIT
105r: OUTPUT CIRCUIT
110, 111, 112: INPUT TERMINAL
113: OUTPUT TERMINAL
COUT: COUNT SIGNAL
EN: ENABLE SIGNAL
PH0~PH3: PHASE SIGNAL
PSAMP1: PHASE SAMPLING CIRCUIT
PSTOP: SAMPLING SIGNAL (STOP PHASE SIGNAL)
RCOUNT1: RIPPLE COUNTER
RST: RESET SIGNAL
RSTGEN: RESET SIGNAL GENERATING CIRCUIT
SRL: SR LATCH
START: START SIGNAL
STOP: STOP SIGNAL
TDC_OUT: OUTPUT SIGNAL
VCO1r: OSCILLATOR CIRCUIT 121, 131: INPUT TERMINAL
132: OUTPUT TERMINAL
DEL0: DELAY CIRCUIT
INV1: INVERTER
N0, N1A~N1B: N-CHANNEL TRANSISTOR
P0, P1A~P1B: P-CHANNEL TRANSISTOR
VDD: POWER SUPPLY VOLTAGE

TIME-TO-DIGITAL CONVERSION CIRCUIT

CROSS-REFERENCE TO RELATED APPLICATION

The present application claims priority from Provisional Application 62/847,271, the content to which is hereby incorporated by reference into this application.

BACKGROUND OF THE INVENTION

1. Field of the Invention

One aspect of the present invention relates to a time-to-digital conversion circuit.

2. Description of the Related Art

Time-to-digital conversion (TDC) has recently attracted attention as one of the data discretization techniques. Therefore, various ideas for the configuration of a TDC circuit have been proposed (for example, refer to Patent Literature 1 and Non-Patent Literature 1 and 2 listed below).
[PTL 1] U.S. Patent Application Publication No. 2015/0077279 Specification

Non Patent Literature

[NPL 1] "A 780×800 µm$^2$ Multichannel Digital Silicon Photomultiplier With Column-Parallel Time-to-Digital Converter and Basic Characterization", Shingo Mandai, Vishwas Jain, and Edoardo Charbon, IEEE TRANSACTIONS ON NUCLEAR SCIENCE, VOL. 61, NO. 1, FEBRUARY 2014
[NPL 2] "A 100-m Range 10-Frame/s 340×96-Pixel Time-of-Flight Depth Sensor in 0.18-µm CMOS", Cristiano Niclass, Mineki Soga, Hiroyuki Matsubara, Satoru Kato, and Manabu Kagami, IEEE JOURNAL OF SOLID-STATE CIRCUITS, VOL. 48, NO. 2, FEBRUARY 2013

SUMMARY OF THE INVENTION

However, there is still room for improvement in terms of specific idea points for improving the performance of a TDC circuit. One aspect of the present invention is directed to realizing a TDC circuit that is more excellent in performance than in related-art techniques.

(1) An embodiment of the present invention provides a time-to-digital conversion circuit to which a start signal and a stop signal are input. The time-to-digital conversion circuit includes an oscillator circuit that outputs a plurality of phase signals different from each other, begins oscillating in accordance with the start signal and stops oscillating in accordance with the stop signal, and a counter that counts a number of edges of at least one phase signal among the plurality of phase signals and outputs a count signal indicating the number of edges. In the time-to-digital conversion circuit, the phase of the oscillator circuit is specified in accordance with a value of each of the plurality of phase signals, and the phase at a start time point at which the start signal is input and the phase at a stop time point at which the stop signal is input are referred to as a start phase and a stop phase, respectively. The time-to-digital conversion circuit further includes a phase sampling circuit that samples the values of each of the plurality of phase signals at the stop time point and outputs a stop phase signal indicating the stop phase, a start phase signal generating circuit that outputs a start phase signal for specifying the start phase, and an output circuit that, based on the count signal, the stop phase signal, and the start phase signal, generates an output signal. The output signal is a digital signal indicating a time period from the start time point to the stop time point.

(2) Additionally, some embodiment of the present invention provides a time-to-digital conversion circuit in which, in addition to the configuration of (1) mentioned above, the start phase signal generating circuit outputs a pseudo-random signal as the start phase signal, and thereby updates the start phase each time the count signal is initialized.

(3) Additionally, some embodiment of the present invention provides a time-to-digital conversion circuit in which, in addition to the configuration of (1) mentioned above, the start phase signal generating circuit outputs, as the start phase signal, a signal of a value periodically varying in a predetermined pattern, and thereby updates the start phase each time the count signal is initialized.

According to a TDC circuit according to one aspect of the present invention, a TDC circuit that is more excellent in performance than in related-art techniques may be realized.

BRIEF DESCRIPTION OF THE DRAWINGS

FIG. 1 is a diagram schematically illustrating a configuration of a TDC circuit in a first embodiment.
FIG. 7 is a diagram schematically illustrating a configuration of a TDC circuit in a second embodiment.
FIG. 11 is a diagram illustrating an example of the relationship between Q0 to Q3 and PSTOP in the phase sampling circuit in FIG. 10.
FIG. 12 is a diagram schematically illustrating a configuration of a TDC circuit as a comparison example.

DETAILED DESCRIPTION OF THE INVENTION

First Embodiment

Figures 2, 3:
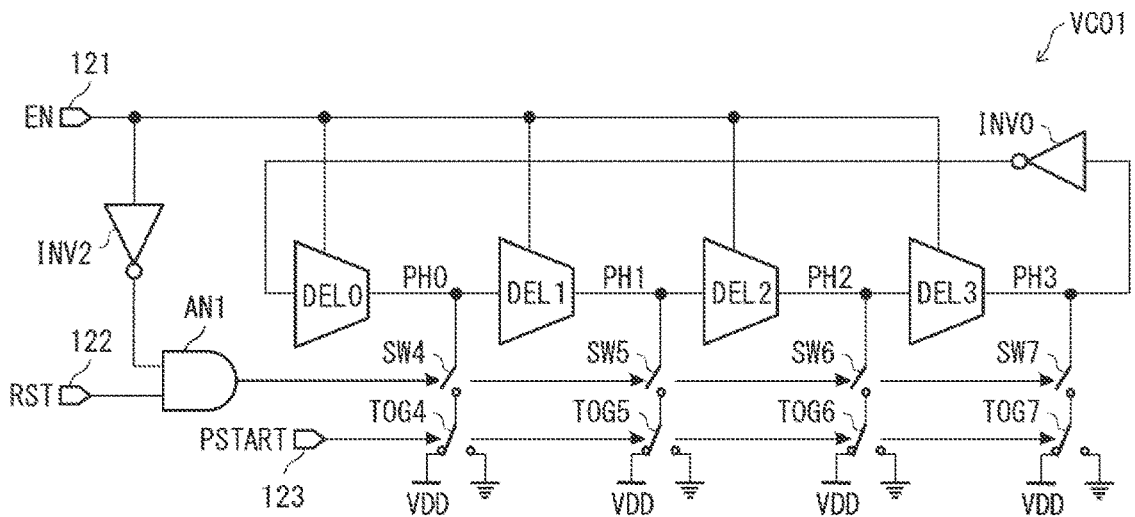
FIG. 2 is a diagram schematically illustrating a configuration of an oscillator circuit in the TDC circuit in FIG. 1.
FIG. 3 is a diagram illustrating an example of the relationship between PSTART or PHASE and PH0 to PH3 in the TDC circuit in FIG. 1.

Hereinafter, a TDC circuit 1 (time-to-digital conversion circuit) in a first embodiment will be described. Note that, for convenience of explanation, members having the same functions as members described in the first embodiment are denoted by the same reference symbols in the following embodiments, and the description thereof will not be repeated. Additionally, for items the same as or similar to those of known techniques, description thereof is omitted as appropriate.

(Comparison Example)

First, prior to specific explanation of the TDC circuit 1, a comparison example is described. FIG. 12 is a diagram schematically illustrating a configuration of a TDC circuit 1r as a comparison example. The TDC circuit 1r is an example of related-art TDC circuits. Circuit configurations the same as or similar to that illustrated in FIG. 12 are disclosed in, for example, NPL 1 and PTL 1.

The TDC circuit 1r includes an oscillator circuit VCO1r, a ripple counter RCOUNT1 (counter), a phase sampling circuit PSAMP1, a reset signal generating circuit RSTGEN, an SR latch SRL, and an output circuit 105r.

The TDC circuit 1r also includes an input terminal 110 to which a clock signal CLK is input, an input terminal 111 to which a start signal START is input, and an input terminal 112 to which a stop signal STOP is input. The input terminals 110 to 112 are also referred to as a clock input terminal, a start input terminal, and a stop input terminal, respectively. The TDC circuit 1r further includes an output terminal 113 for outputting an output signal TDC_OUT.

Note that, in the description given below, for example, "oscillator circuit VCO1r" is also abbreviated simply as "VCO1r". Other members and signals are abbreviated similarly as appropriate.

In the following description, "1" and "0" are used as values (logic values) of each digital signal. The voltage value of a digital signal having a value "1" corresponds to a power supply voltage VDD (unit: V). In contrast, the voltage value of a digital signal having a value "0" corresponds to a ground voltage (0 V).

The VCO1r includes an input terminal 121 to which an enable signal EN is input and an input terminal 122 to which a reset signal RST is input. The input terminal 121 and the input terminal 122 are also referred to as an enable input terminal and a reset input terminal, respectively. The VCO1r outputs four different phase signals PH0 to PH3 (also refer to FIG. 13 described later).

The RCOUNT1 obtains a specific phase signal (at least one phase signal) among PH0 to PH3. In the example illustrated in FIG. 12, the RCOUNT1 obtains PH0 as the specific phase signal. The RCOUNT1 counts the number of edges of PH0 and outputs a count signal COUT indicating a result of the count (the number of counted edges) (also refer to FIG. 4 described later). Hereafter, the "number of edges" is also abbreviated simply as "edges". The RCOUNT1 may be a known ripple counter with a reset function.

The PSAMP1 obtains PH0 to PH3. STOP is also input to the PSAMP1. The PSAMP1 samples PH0 to PH3 when triggered by STOP=1. The PSAMP1 outputs a sampling signal PSTOP (stop phase signal) indicating a result of the sampling. Hereafter, "triggered by STOP=1" is abbreviated simply as "triggered by STOP". Additionally, "input STOP=1" is also referred to as "input STOP" or "cause STOP to be ON". Other signals are similarly represented as appropriate.

The RSTGEN generates RST and supplies this RST to the VCO1r and the RCOUNT1. RST is used as a signal for resetting (initializing) the VCO1r and the RCOUNT1 to their initial states before measurement (time measurement) triggered by START.

START and STOP are input to an S terminal and an R terminal, respectively, of the SRL. The SRL generates an output signal in accordance with START and STOP. The SRL then supplies the output signal as EN from a Q terminal (an output terminal) to the VCO1r. EN is used as a signal for controlling the oscillation state of the VCO1r.

Specifically, when START is 1, the SRL outputs EN=1 as an output signal. The VCO1r oscillates when EN is 1. In contrast, when STOP is 1, the SRL outputs EN=0 as an output signal. The VCO1r stops oscillating when EN is 0. In this way, in accordance with EN (in other words, in accordance with START and STOP), the oscillation state of the VCO1r may be controlled.

Prior to measurement in the TDC circuit 1r, the VCO1r is reset to the initial state when triggered by RST. After that, the VCO1r begins oscillating when triggered by START. After that, the VCO1r stops oscillating when triggered by STOP. Therefore, immediately before the VCO1r begins oscillating when triggered by START, PH0 to PH3 are set to the predetermined initial states (specific initial states).

That is, immediately before the VCO1r begins oscillating, the phase (phase value) of the VCO1r is fixed to a specific initial phase. Note that the phase of the VCO1r is specified in accordance with the respective values of PH0 to PH3. Specifically, the phase of the VCO1r at a certain time point indicates the pattern of values of PH0 to PH3 at this certain time point.

Prior to the beginning of measurement triggered by START, the RCOUNT1 is reset to the initial state when triggered by RST. That is, COUT is reset to the initial value (example: 0). After that, when the VCO1r begins oscillating when triggered by START, the RCOUNT1 obtains PH0 as an input clock and counts the edges of this PH0. Specifically, the RCOUNT1 counts the rising edges or the falling edges of an input clock (PH0). In the example in FIG. 4, the RCOUNT1 counts the rising edges of PH0. If the VCO1r stops oscillating when triggered by STOP, the count operation of the RCOUNT1 also stops.

The output circuit 105r acquires (i) COUT from the RCOUNT1 and (ii) PSTOP from the PSAMP1. Based on COUT and PSTOP, the output circuit 105r generates TDC_OUT and supplies this TDC_OUT to the output terminal 113. Specifically, TDC_OUT is generated as a signal indicating a time lag between the ON time point of START (start time point) and the ON time of STOP (stop time point).

Figure 13:
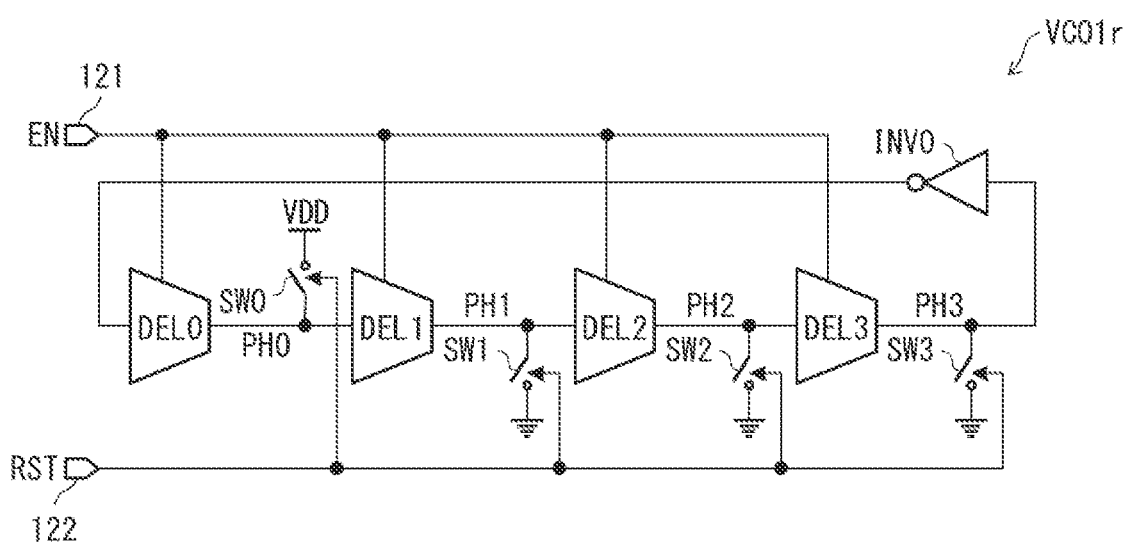
FIG. 13 is a diagram schematically illustrating a configuration of an oscillator circuit in the TDC circuit in FIG. 12.

FIG. 13 is a diagram schematically illustrating a configuration of the VCO1r. The VCO1r includes four delay circuits DEL0 to DEL3, switches SW0 to SW3, and an inverter INV0. The SW0 to the SW3 are switches for respectively coupling (more specifically short-circuiting) output terminals of the DEL0 to the DEL3 to VDD or the ground. The DEL0 to the DEL3 output PH0 to PH3, respectively. The INV0 is also referred to as a NOT gate (or an inverting logic circuit). ON/OFF (conductive/open) of the SW0 to the SW3 is controlled by RST. In the following examples, the SW0 to the SW3 are to be OFF when RST is 0, and the SW0 to the SW3 are to be ON when RST is 1.

In the VCO1r, the DEL0 to the DEL3 are coupled in series. That is, four delay circuits are coupled in series in the VCO1r. The INV0 is coupled to the DEL0 and the DEL3. Specifically, PH3, which is an output of the DEL3 (at the final stage), is input to the INV0. The INV0 inverts the logic value of PH3. The INV0 then supplies (more specifically, feeds back) PH3 after the inversion to an input terminal of the DEL0 (at the head stage).

Figure 14:
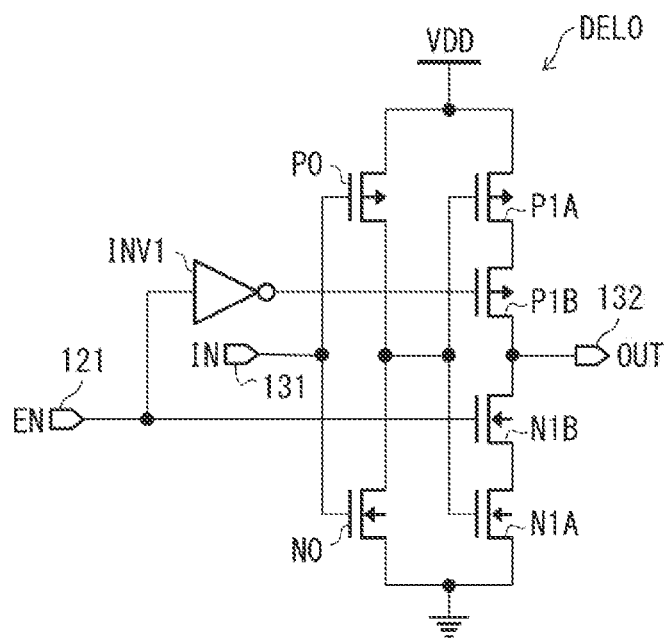
FIG. 14 is a diagram schematically illustrating a configuration of one delay element in the oscillator circuit in FIG. 13.

FIG. 14 is a diagram schematically illustrating a configuration of the DEL0. The configurations of the DEL1 to the DEL3 are the same as or similar to that of the DEL0. Therefore, with reference to the DEL0 in FIG. 14, the configuration and operations of each delay circuit are illustrated. The DEL0 includes, in addition to the input terminal 121, an input terminal 131 and an output terminal 132. An input signal IN is input to the input terminal 131. The output terminal 132 is a terminal for outputting an output signal OUT. OUT in FIG. 14 corresponds to PH0.

The DEL0 includes an inverter INV1 for inverting the logic value of EN. The DEL0 also includes n-channel transistors N0, N1A, and N1B and p-channel transistors P0, P1A, and P1B paired with these n-channel transistors.

When EN is 1, the connection between the source and drain terminals of each of the N1B and the P1B is ON (conductive). In this case, IN input to the input terminal 131 is delayed, and IN after the delay is output as OUT at the output terminal 132.

In contrast, when EN changes from 1 to 0, the connection between the source and drain terminals of each of the N1B and the P1B is caused to be OFF (open). In this case, IN input to the input terminal 131 is not transmitted to the output terminal 132. That is, the output terminal 132 has a high impedance. Hence, the voltage of the output terminal 132 immediately before EN changes to 0 is held as OUT.

In such a manner, in a period in which EN is 0, the respective output impedances of the DEL0 to the DEL3 are high. In this case, PH0 to PH3 may be biased to 0 (0 V) or 1 (VDD) by setting RST=1 for a short period to cause the SW0 to the SW3 to be ON. This operation completes the resetting of the VCO1r.

As illustrated in FIG. 14, each of the DEL0 to the DEL3 includes a plurality of transistors. As generally known, there are variations among individual transistor characteristics. Accordingly, there are also variations among the respective time intervals (example: eight respective time intervals) into which one oscillation period of the VCO1r is divided in accordance with phase signals (also refer to FIG. 4).

As described above, the phase at the time at which the VCO1r begins oscillating (that is, the respective values of PH0 to PH3 at the time at which oscillation begins) is fixed to a specific value. Therefore, it is generally known that it is difficult to realize the TDC circuit 1r with high linearity when there are variations in the characteristics (delay characteristics) of the DEL0 to the DEL3.

Additionally, the power consumption of an oscillator circuit generally accounts for much of the power consumption in a TDC circuit. Accordingly, in the TDC circuit (example: the TDC circuit of NPL 2) in which an oscillator circuit continues to oscillate all the time, the power consumption is large. However, in such a TDC circuit, the linearity of the TDC circuit may be improved by making the oscillating frequency and phase of the oscillator circuit asynchronous with START and STOP, which are input signals.

In contrast, in some TDC circuits (example: the TDC circuits of NPL 1 and PTL 1, that is, the TDC circuit 1r), beginning/stopping of oscillation of an oscillating circuit may be controlled in accordance with START and STOP, which are input signals. Therefore, the power consumption of the TDC circuit may be reduced by allowing an oscillator circuit to operate only during a period when the time measurement is desired. However, as described above, generally in such a TDC circuit, the linearity of the TDC circuit is not good.

(TDC Circuit 1)

As in the foregoing description, related-art techniques are unable to achieve both a power consumption reduction and improvements in the linearity of a TDC circuit. To address this issue, the inventor of the present application has created a new TDC circuit (the TDC circuit 1). As described in detail hereinafter, according to the TDC circuit 1, both a power consumption reduction and improvements in the linearity of a TDC circuit may be achieved.

FIG. 1 is a diagram schematically illustrating a configuration of the TDC circuit 1. Unlike the TDC circuit 1r, the TDC circuit 1 further includes a random signal generating circuit RANDGEN (start phase signal generating circuit). Additionally, an oscillator circuit and an output circuit in the TDC circuit 1 are also referred to as an oscillator circuit VCO1 and an output circuit 105, respectively. The VCO1 outputs PH0 to PH3 in accordance with START and STOP that are input signals to the TDC circuit 1.

The RANDGEN sets a start phase signal PSTART. PSTART specifies the phase (start phase) of the VCO1 at a start time (a time t1 in FIG. 4) described later. In a first embodiment, the case where PSTART is a pseudo-random signal is illustrated. In this case, the RANDGEN may be a known pseudo-random number generating circuit. The RANDGEN supplies PSTART to the VCO1 and the output circuit 105. Therefore, in addition to RST and EN, PSTART is further input to the VCO1. Additionally, in addition to COUT and PSTOP, PSTART is further input to the output circuit 105.

The output circuit 105 calculates (generates) TDC_OUT by the following equation (1), $$TDC\_OUT=COUT \times 8+(PSTOP-PSTART)+1 \quad (1)$$

Figure 4:
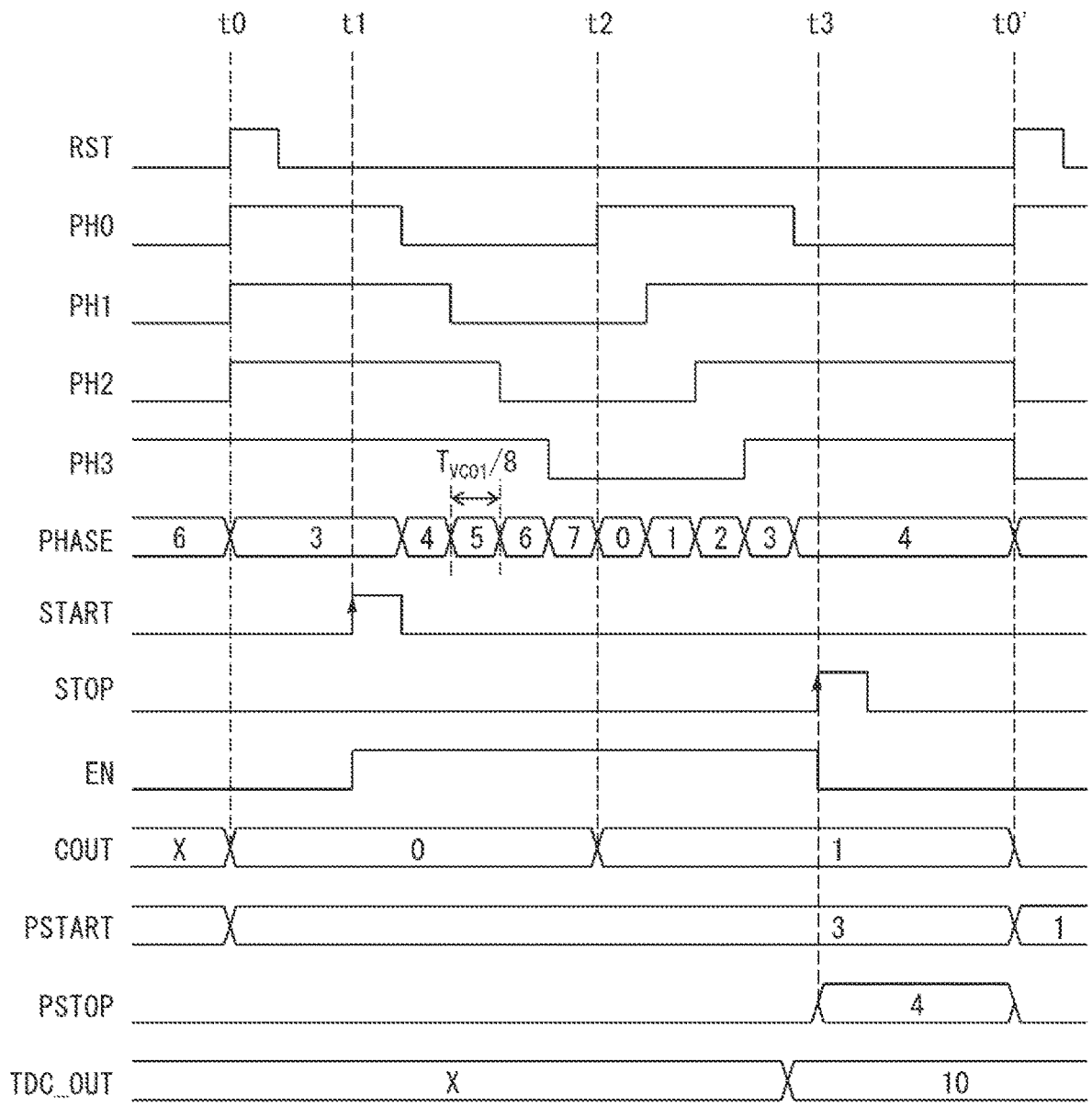
FIG. 4 is a diagram illustrating changes of signals over time in the TDC circuit in FIG. 1.

TDC_OUT calculated by equation (1) represents a time lag between the start time point and the stop time point (a time period from the time t1 to a time t3 in FIG. 4). One oscillation period of the VCO1 is assumed to be able to be divided into eight partial periods in accordance with the respective values of four phase signals PH0 to PH3 (4-bit phase signals) input to the PSAMP1. The coefficient "8" of equation (1) is based on this assumption.

(Example of Configuration of VCO1)

FIG. 2 is a diagram schematically illustrating a configuration of the VCO1. The switches of the VCO1 are referred to as switches SW4 to SW7. The SW4 to the SW7 are the respective switches for coupling the output terminals of the DEL0 to the DEL3 to VDD or the ground. Unlike the VCO1r, the VCO1 further includes an inverter INV2, an AND gate AN1, and toggle switches TOG4 to TOG7 corresponding to the SW4 to the SW7.

Additionally, the VCO1 further includes an input terminal 123 to which PSTART is input. The input terminal 123 is also referred to as a start phase signal input terminal. ON/OFF of the TOG4 to the TOG7 is controlled in accordance with PSTART. PSTART is supplied to each of the TOG4 to the TOG7 from the input terminal 123.

The inverter INV2 inverts EN and inputs EN after the inversion (hereafter, EN') to the AN1. In addition to EN' supplied from the inverter INV2, RST is input to the AN1 from the input terminal 122. The AN1 outputs ANOUT=EN'×RST to each of the SW4 to the SW7.

When EN is 1, EN'=0. Therefore, regardless of RST, ANOUT=0. Hence, the SW4 to the SW7 are caused to be OFF. Additionally, as described above, when EN is 1, each of the DEL0 to the DEL3 delays a signal (IN) input to itself and outputs the delayed input signal as OUT (also refer to FIG. 14). Therefore, when EN is 1, the VCO1 oscillates at a predetermined oscillating frequency determined by the respective delay amounts of the DEL0 to the DEL3. Note that while the VCO1 is oscillating, the SW4 to the SW7 are OFF.

In contrast, when EN is 0, the respective output impedances of the DEL0 to the DEL3 are high, as described above. Thereby, the oscillation of the VCO1 stops.

Subsequently, the case where EN is 0 and RST is 1 is considered. In this case, ANOUT=1. Hence, the SW4 to the SW7 are caused to be ON. In this case, the respective values of PH0 to PH3 are set to 1 (VDD) or 0 (0 V) via the TOG4 to the TOG7. Since the operations of the TOG4 to the TOG7 are the same or similar, description will be given of the TOG4.

When EN is 0 and RST is 1, the output terminal 132 (output: PH0) of the DEL0 is coupled via the SW4 to one terminal of the TOG4 (a terminal on the upper side of the TOG4 in the example in FIG. 2).

In the present embodiment, when PSTART=0 to 3, the terminal mentioned above of the TOG4 is assumed to be coupled to the power supply side (the VDD side). In this case, VDD is applied to the output terminal 132 of the DEL0, and therefore PH0 is 1 (also refer to FIGS. 3 and 4 described below).

In contrast, when PSTART=4 to 7, the terminal mentioned above of the TOG4 is assumed to be coupled to the side of a ground terminal (the ground side). In this case, a ground voltage (0 V) is applied to the output terminal 132 of the DEL0, and therefore PH0 is fixed to the initial value (0).

Table TB10 in FIG. 3 illustrates an example of the relationship between PSTART and the initial values of PH0 to PH3. The phase signal PHASE in FIG. 3 illustrates the phase of the VCO1. Therefore, TB10 may be read as the relationship between PHASE and PH0 to PH3.

As illustrated in TB10, PSTART is set randomly each time the time measurement of the TDC circuit 1 is performed (more specifically, each time RST is caused to be ON). That is, PH0 to PH3 are set randomly each time the time measurement of the TDC circuit 1 is performed.

PSTART in the example illustrated in FIG. 3 is a pseudo-random number that takes any value between 0 and 7 and is updated each time the measurement of the TDC circuit 1 is performed. As described above, PH0 is 1 "when PSTART=0 to 3" and 0 "when PSTART=4 to 7".

In the example illustrated in FIG. 3, PH1 is 1 "when PSTART=1 to 4" and 0 "when PSTART=5 to 7 and 0". That is, the values of PH1 determined in accordance with PSTART are set so as to shift from those of PH0 by one value. In this regard, PH2 and PH3 are set likewise.

Specifically, PH2 is 1 "when PSTART=2 to 5" and is 0 "when PSTART=6, 7, 0 and 1". Furthermore, PH3 is a signal obtained in such a way that PH2 is delayed by the DEL3. Therefore, PH3 is 1 "when PSTART=3 to 6" and 0 "when PSTART=7 and 0 to 2".

Hence, as illustrated in FIG. 3, in accordance with PSTART, eight pattern combinations of PH0 to PH3 are set randomly. That is, each time RST is caused to be ON, eight types of start phases (PHASE at the start time points) are set randomly. In this way, according to the TDC circuit 1, the effects of delay variations among the DEL0 to the DEL3 may be randomized in each measurement.

As described above, since the effects of delay variations among the DEL0 to the DEL3 may be suppressed according to the TDC circuit 1, the linearity of a TDC circuit may be improved compared with the TDC circuit 1r (example: TDC circuits of NPL 1 and PTL 1). That is, compared with the TDC circuit 1r, the measurement accuracy of a TDC circuit may be improved (more specifically, the distortion characteristics of a measuring result caused by the delay variations described above may be mitigated).

In addition, according to the TDC circuit 1, beginning/stopping of oscillation of the VCO1 may be controlled in accordance with START/STOP. Hence, power consumption may be reduced compared with the TDC circuit of NPL 2. In this way, according to the TDC circuit 1, unlike related-art TDC circuits, both a power consumption reduction and improvements in the linearity of a TDC circuit may be achieved. That is, a TDC circuit that is more excellent in performance than in related-art TDC circuits may be realized.

(Timing Chart in TDC Circuit 1)

FIG. 4 is a timing chart illustrating the manner of changes of signals in the TDC circuit 1. With reference to FIG. 4, an example of operations of the TDC circuit 1 will be described below. The "time" in the following description may be read as a "time point".

First, at a time t0 (reset time), RST is caused to be ON. As RST becomes ON, COUT (an output of the RCOUNT1) is reset to 0. Additionally, as RST becomes ON, the RANDGEN updates PSTART (an output of the RANDGEN).

In the example illustrated in FIG. 4, at t0, PSTART is updated to 3 (an example of the random value). Therefore, at t0, all of PH0 to PH3 are set to 1 (also refer to FIG. 3). That is, PHASE at t0 is set to 3. Also, at the time t1 described below, PHASE is maintained at 3. In this way, in the example illustrated in FIG. 4, the start phase is set to 3.

Then, at the time t1 (start time), START is caused to be ON. As START becomes ON, EN is also caused to be ON. As a result, oscillation of the VCO1 begins. That is, time measurement in the TDC circuit begins. The value of PHASE is updated at each time interval $\Delta t = T_{VCO1}/8$, which is determined by the oscillating frequency of the VCO1. Note that when the oscillating frequency of the VCO1 is $f_{VCO1}$, $T_{VCO1} = 1/f_{VCO1}$ is given.

In the example illustrated in FIG. 4, the respective values of PH0 to PH3 change over time at each $\Delta t$. Hence, at each $\Delta t$, PHASE changes such that "3 (start phase)→4→5→ . . . " (also refer to FIG. 3). In the example illustrated in FIG. 4, at a time t2, PH0 changes from 0 to 1. Therefore, at t2, the rising edge of PH0 is counted by the RCOUNT1 and COUT is updated to 1.

After that, at the time point t3 (stop time), STOP is caused to be ON. As STOP becomes ON, the values of PH0 to PH3 at t3 are sampled by the PSAMP1. Since, at t3, PH0 is 0 and PH1 to PH3 are 1, as a result of sampling, PSTOP is updated to 4 (also refer to FIG. 5 and FIG. 6 described later). That is, in the example illustrated in FIG. 4, the stop phase is 4. Additionally, at t3, as STOP becomes ON, EN is caused to be OFF. As a result, the oscillation of the VCO1 is stopped.

As illustrated in FIG. 4, at t3 (more strictly, immediately after t3), COUT=1, PSTART=3, and PSTOP=4. Therefore, the output circuit 105 outputs TDC_OUT=10 based on equation (1). That is, the TDC circuit 1 in the present embodiment measures the time lag between t1 and t3 as "10×$\Delta t$".

After that, at a time t0' (a reset time following t0), RST is caused to be ON. At t0', COUT is again reset to 0. Additionally, at t0', the RANDGEN updates PSTART again. In the example illustrated in FIG. 4, at t0', PSTART is updated to 1 (another example of the random value). Then, processing the same as or similar to that described above is repeated.

(Example of Configuration of PSAMP1)

Figures 5, 6:
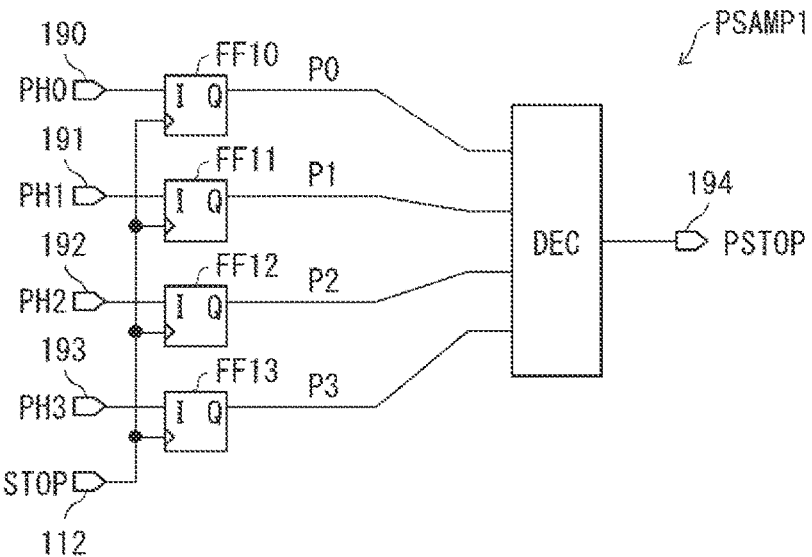
FIG. 5 is a diagram schematically illustrating a configuration of a phase sampling circuit in the TDC circuit in FIG. 1.
FIG. 6 is a diagram illustrating an example of the relationship between P0 to P3 and PSTOP in the phase sampling circuit in FIG. 5.

FIG. 5 is a diagram schematically illustrating a configuration of the PSAMP1. The PSAMP1 includes four flip-flops FF10 to FF13 and a decoder DEC. The PSAMP1 also includes, in addition to the input terminal 112, (i) input terminals 190 to 193 to which PH0 to PH3 are respectively input, and (ii) an output terminal 194 for outputting PSTOP, which is an output of the DEC (in other words, an output of the PSAMP1).

By way of example, the FF10 to the FF13 are delay-type flip-flops (more specifically, D flip-flops). The respective clock terminals of the FF10 to the FF13 are coupled to the input terminal 112. That is, each of the FF10 to the FF13 obtains STOP as an input clock.

An I terminal (an input terminal, a D terminal in the D flip-flop) of the FF10 is coupled to the input terminal 190. Therefore, PH0 is supplied as an input signal to the FF10. According to this configuration, in response to the fact that STOP is caused to be ON, the FF10 holds the value of PH0 at the stop time point (t3 in FIG. 4) as an output signal P0. The FF10 then outputs P0 from the Q terminal (the output terminal). In this way, the FF10 performs an operation (sampling operation) for holding the value of an input signal. In this regard, the FF11 to the FF13 described below are the same as or similar to the FF10.

Likewise, the respective I terminals of the FF11 to the FF13 are coupled to the input terminals 191 to 193. Therefore, PH1 to PH3 are supplied as input signals to the FF11 to the FF13, respectively. According to this configuration, the FF11 to the FF13 hold the values of PH1 to PH3 at the stop time point as output signals P1 to P3, respectively. The FF11 to the FF13 output P1 to P3 from their Q terminals, respectively.

All of the Q terminals of the FF10 to the FF13 are coupled to the DEC. Therefore, P0 to P3 are supplied as input signals to the DEC. The DEC generates PSTOP by decoding P0 to P3 (that is, PH0 to PH3 sampled by the FF10 to the FF13) and supplies this PSTOP to the output terminal 194.

Specifically, the DEC generates PSTOP in accordance with P0 to P3, as in Table TB11 illustrated in FIG. 6. The relationship between P0 to P3 and PSTOP in TB11 is set so as to be associated with the relationship of PH0 to PH3 in TB10. In the first embodiment, the relationship between P0 to P3 and PSTOP in TB11 matches the relationship of PH0 to PH3 in TB10. As illustrated in TB11, PSTOP in accordance with P0 to P3 is generated, so that PHASE at the stop time point (stop phase) may be represented by this PSTOP. From this, PSTOP may be referred to as a stop phase signal.

[Modifications]

(1) In the first embodiment, the case where PSTART is a pseudo-random signal is illustrated. However, PSTART is not limited to a pseudo-random signal but may be a signal whose value periodically varies in a predetermined pattern (example: a sequential signal). By way of example, PSTART may be a signal whose value varies in the order of "0→1→2→3→4→5→6→7" each time RST is caused to be ON. In this case, after 7, PSTART returns to 0 and then changes in the same pattern.

With such PSTART, the effects of delay variations among the DEL0 to the DEL3 may be suppressed, and thus effects the same as or similar to those in the first embodiment are attained. In this case, instead of a pseudo-random number generating circuit, a known pattern generator may be used as a start phase signal generating circuit, and therefore the cost of the TDC circuit 1 may be reduced. However, in order to more reliably offset the effects of delay variations among the DEL0 to the DEL3, it is desirable to generate PSTART as a pseudo-random signal.

(2) In the first embodiment, the case where each of the phase signals (PH0 to PH3) is a digital signal is illustrated. However, like the techniques in NPL 1, PH0 to PH3 may be handled as analog values (also refer to a second embodiment). That is, PH0 to PH3 may be analog signals. Also in this case, the same or similar effects are attained.

Second Embodiment

FIG. 7 is a diagram schematically illustrating a configuration of a TDC circuit 2 in a second embodiment. Unlike the TDC circuit 1, the TDC circuit 2 includes an oscillator circuit VCO2 and a phase sampling circuit PSAMP2. Unlike the VCO1, the VCO2 outputs two phase signals PH0 and PH1. Therefore, the PSAMP2 samples PH0 and PH1.

In this way, the number of phase signals generated in an oscillator circuit according to one aspect of the present invention may be two or more (at least two) and is not limited to four. According to the TDC circuit 2, effects the same as or similar to those according to the TDC circuit 1 are attained.

(Example of Configuration of VCO2)

Figure 8:
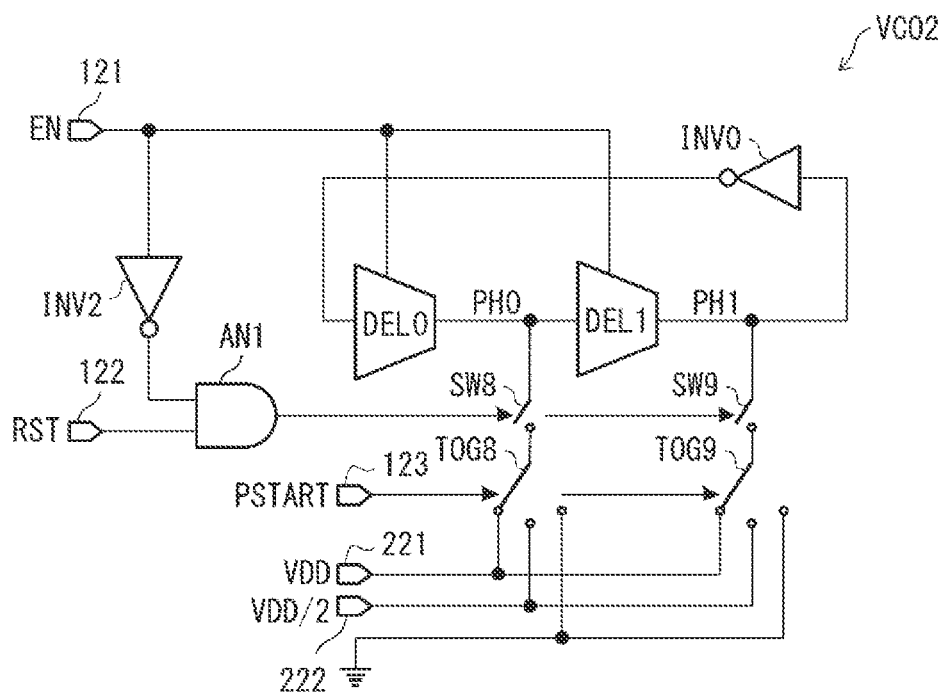
FIG. 8 is a diagram schematically illustrating a configuration of an oscillator circuit in the TDC circuit in FIG. 7.

FIG. 8 is a diagram schematically illustrating a configuration of the VCO2. Unlike the VCO1, the VCO2 includes two delay circuits, the DEL0 and the DEL1. In the VCO2, two delay circuits are coupled in series. The VCO2 includes switches SW8 and SW9 and toggle switches TOG8 and TOG9. The SW8 and the TOG8 are provided to correspond to the DEL0, and the SW9 and the TOG9 are provided to correspond to the DEL1.

The VCO2 also includes input terminals 221 and 222. VDD is applied to the input terminal 221, and VDD/2 to the input terminal 222.

Like the VCO1 in the first embodiment, when EN is 1, the VCO2 oscillates at a predetermined oscillating frequency determined by respective delaying amounts of the DEL0 and the DEL1. During oscillation of the VCO2, the SW8 and the SW9 are caused to be OFF. In contrast, when EN is 0, the oscillation of the VCO2 stops.

When EN is 0 and RST is 1, the SW8 and the SW9 are caused to be ON. In this case, the respective values of PH0 and PH1 are set via the TOG8 and the TOG9 to any of 1 (VDD), 0.5 (VDD/2), and 0 (0 V). In this way, in the second embodiment, unlike in the first embodiment, each phase signal (each of PH0 and PH1) is set as a signal that takes three different values. PH0 and PH1 in the second embodiment 2 are, by way of example, analog values and are not limited to the example mentioned above.

In this way, setting PH0 and PH1 as analog values enables the same number of phase patterns as in the first embodiment to be achieved even when the number of phase signals is reduced (also refer to FIG. 9 described below).

The operations of the TOG8 and the TOG9 are the same or similar, and therefore description will be given of the TOG8. When EN is 0 and RST is 1, the output terminal 132 (output: PH0) of the DEL0 is coupled via the SW8 to one terminal of the TOG8 (the upper terminal of the TOG8 in the example illustrated in FIG. 8).

In the present embodiment, when PSTART=1 to 3, the terminal mentioned above of the TOG8 is assumed to be coupled to the side of VDD. In this case, VDD is applied to the output terminal 132 of the DEL0, and therefore PH0 is 1 (also refer to FIG. 9 described below).

Additionally, when PSTART=0 or 4, the terminal mentioned above of the TOG8 is assumed to be coupled to the side of VDD/2. In this case, VDD/2 is applied to the output terminal 132 of the DEL0, and therefore PH0 is 0.5.

Furthermore, when PSTART=5 to 7, the terminal mentioned above of the TOG8 is assumed to be coupled to the ground side. In this case, 0 V is applied to the output terminal 132 of the DEL0, and therefore PH0 is 0.

Figures 9, 10:
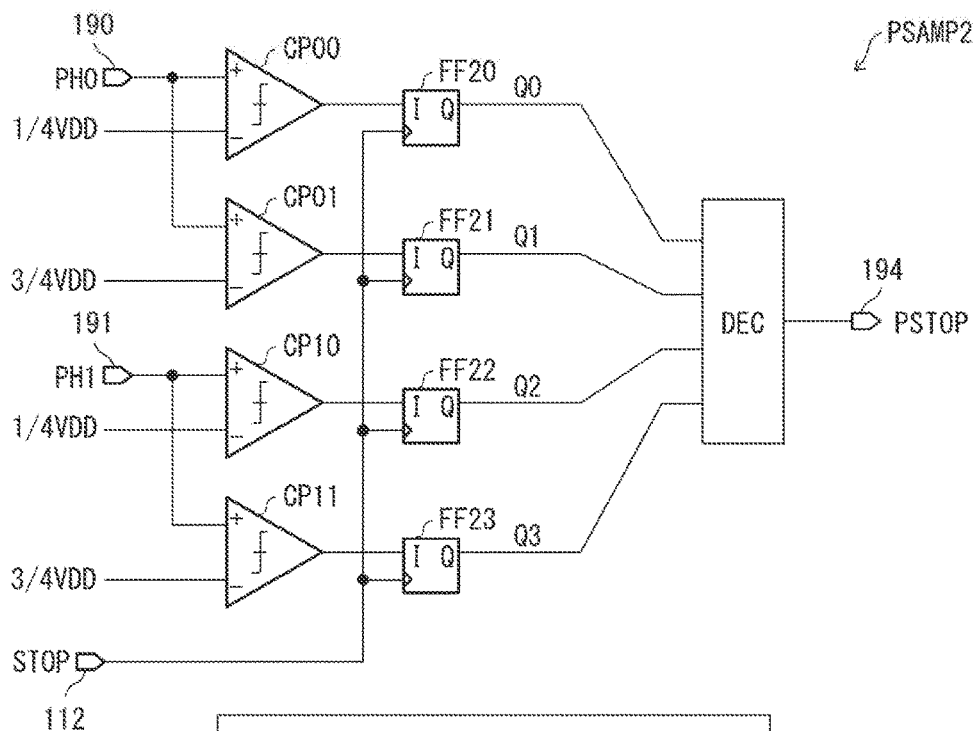
FIG. 9 is a diagram illustrating an example of the relationship between PSTART or PHASE and PH0 and PH1 in the TDC circuit in FIG. 7.
FIG. 10 is a diagram schematically illustrating a configuration of a phase sampling circuit in the TDC circuit in FIG. 7.

Table TB20 in FIG. 9 illustrates an example of the relationship between PSTART and the initial values of PH0 and PH1. PHASE in FIG. 9 represents the phase of the VCO2. Therefore, TB20 may be read as the relationship between (1)PHASE and (2)PH0 and PH1.

PSTART specifies the start phase, as is the case in the first embodiment. As illustrated in TB20, each time RST is caused to be ON, PH0 and PH1 are set randomly. PSTART in the example illustrated in FIG. 9 is assumed to be a pseudo-random number that takes any value between 0 and 7, as is the case in the first embodiment.

As described above, PH0 is 1 "when PSTART=1 to 3", 0.5 "when PSTART=0 or 4", and 0 "when PSTART=5 to 7". In the example illustrated in FIG. 9, PH1 is 1 "when PSTART=3 to 5", 0.5 "when PSTART=2 or 6", and 0 "when PSTART=7, 0, or 1". That is, in the example illustrated in FIG. 9, the values of PH1 determined in accordance with PSTART are set so as to shift from those of PH0 by two values.

In this way, in the TDC circuit 2, in accordance with PSTART, eight pattern combinations of PH0 and PH1 are set randomly. That is, likewise in the TDC circuit 1, each time RST is caused to be ON, eight types of start phases are set randomly.

(Example of Configuration of PSAMP2)

FIG. 10 is a diagram schematically illustrating a configuration of the PSAMP2. Unlike the PSAMP1, the PSAMP2 is configured so as to be suitable for decoding of PH0 and PH1 that are ternary signals. Four flip-flops in the PSAMP2 are referred to as flip-flops FF20 to FF23.

Furthermore, unlike the PSAMP1, the PSAMP2 includes four comparators CP00, CP01, CP10, and CP11. These comparators are known analog comparators. The comparator in the example illustrated in FIG. 10 is a 2-input 1-output comparator and generates one digital output in accordance with two analog inputs.

The plus terminal of each of the CP00 and the CP01 is coupled to the input terminal 190. Therefore, PH0 is input to the plus terminal of each of the CP00 and the CP01. In contrast, ¼VDD (equivalent to 0.25) is input to one terminal of the CP00. Additionally, ¾VDD (equivalent to 0.75) is input to the minus terminal of the CP01. The magnitude of a voltage input to the minus terminal of each of the CP00 and the CP01 may be set in accordance with three values of PH0, and is not limited to the example in FIG. 10.

First, the CP00 and the FF20 will be described. The CP00 compares the magnitude of an input signal (PH0) at the plus terminal and the magnitude of an input signal (¼VDD) at the minus terminal, and supplies an output (hereafter, CP00OUT) in accordance with a result of the comparison to the I terminal of the FF20.

Specifically, when PH0 is greater than ¼VDD, the CP00 outputs CP00OUT=1. In contrast, when PH0 is less than or equal to ¼VDD, the CP00 outputs CP00OUT=0. The FF20 holds the value of CP00OUT at the stop time point as an output signal Q0. Then, the FF20 supplies Q0 to the DEC.

According to the configuration described above, when PH0 is 1 or 0.5, CP00OUT is 1 and thus Q0 is also 1. In contrast, when PH0 is 0, CP00OUT is 0 and thus Q0 is also 0 (also refer to FIG. 11 described below).

Likewise, the CP01 compares the magnitude of PH0 and the magnitude of ¾VDD, and supplies an output (hereafter, CP01OUT) in accordance with a result of the comparison to the I terminal of the FF21. Specifically, the CP01 outputs CP01OUT=1 when PH0 is greater than ¾VDD. In contrast, the CP01 outputs CP01OUT=0 when PH0 is less than or equal to ¾VDD. The FF21 holds the value of CP01OUT at the stop time point as an output signal Q1, and supplies the output signal Q1 to the DEC.

According to the configuration described above, when PH0 is 1, CP01OUT is 1 and thus Q1 is also 1. In contrast, when PH0 is 0 or 0.5, CP01OUT is 0 and thus Q1 is also 0.

The CP10 and the CP11 are provided so as to be paired with the CP00 and the CP01, respectively. Specifically, the plus terminal of each of the CP10 and the CP11 is coupled to the input terminal 191. Therefore, PH1 is input to the plus terminal of each of the CP10 and the CP11. Other configurations and operations are the same as or similar to those of the CP00 and the CP01.

The CP10 compares the magnitude of an input signal (PH1) at the plus terminal and the magnitude of an input signal (¼VDD) at the minus terminal, and supplies an output (hereafter, CP10OUT) in accordance with a result of the comparison to the I terminal of the FF22. The FF22 holds the value of CP10OUT at the stop time point as an output signal Q2, and supplies this signal Q2 to the DEC. When PH1 is 1 or 0.5, CP10OUT is 1 and thus Q2 is also 1. In contrast, when PHI is 0, CP10OUT is 0 and thus Q2 is also 0.

Likewise, the CP11 compares the magnitude of PH1 and the magnitude of ¾VDD, and supplies an output (hereafter, CP11OUT) in accordance with a result of the comparison to the I terminal of the FF23. The FF23 holds the value of CP11OUT at the stop time point as an output signal Q3, and supplies this signal Q3 to the DEC. When PH1 is 1, CP11OUT is 1 and thus Q3 is also 1. In contrast, when PH1 is 0 or 0.5, CP11OUT is 0 and thus Q3 is also 0.

The DEC in the second embodiment generates PSTOP by decoding Q0 to Q3, and supplies this PSTOP to the output terminal 194. Specifically, the DEC generates PSTOP in accordance with Q0 to Q3, as in Table TB21 illustrated in FIG. 11.

The relationship between Q0 to Q3 and PSTOP in TB21 is set so as to be associated with the relationship between PH0 and PH1 in TB20. For example, "0, 0.5, and 1" of PH0 in FIG. 9 correspond to "0 and 0, 1 and 0, and 1 and 1" of a pair of Q0 and Q1 in FIG. 11, respectively. Additionally, "0, 0.5, and 1" of PH1 in FIG. 9 correspond to "0 and 0, 1 and 0, and 1 and 1" of a pair of Q2 and Q3 in FIG. 11, respectively. As illustrated in TB21, PSTOP in accordance with Q0 to Q3 is generated, so that the stop phase may be represented by this PSTOP.

[Example of Implementation by Software]

The control blocks (particularly, the RANDGEN) of the TDC circuits 1 and 2 may be implemented by logic circuits (hardware) formed on an integrated circuit (IC chip) or the like, or may be implemented by software.

In the latter case, the TDC circuits 1 and 2 include computers that execute instructions of a program that is software for achieving each function. This computer includes, for example, at least one processor (control device) and includes at least one computer-readable recording medium on which the program mentioned above is stored. In the computer mentioned above, the processor mentioned above reads the program mentioned above from the recording medium mentioned above and executes the program, thereby achieving one aspect of the present invention. As the processor mentioned above, for example, a central processing unit (CPU) may be used. As the recording medium mentioned above, a "non-transitory tangible medium", for example, a tape, a disk, a card, a semiconductor memory, a programmable logic circuit, or the like, as well as a read-only memory (ROM) or the like, may be used. Additionally, a random-access memory (RAM) or the like onto which the program mentioned above is loaded may further be included. Additionally, the program mentioned above may be supplied to the computer mentioned above via any transmission medium (a communication network, broadcast waves, or the like) that can transmit the program. Note that one aspect of the present invention may be realized with the form of carrier-embedded data signals, in which the program mentioned above is embodied by electronic transmission.

APPENDIX

One aspect of the present invention is not limited to each embodiment described above, and various changes may be made within the scope defined by the claims, and embodiments obtained by combining technical means respectively disclosed in different embodiments are also included in one aspect of the present invention. Furthermore, a new technical feature may be formed by combining technical means disclosed in each of embodiments.

What is claimed is:

1. A time-to-digital conversion circuit to which a start signal and a stop signal are input, comprising:
    an oscillator circuit that outputs a plurality of phase signals different from each other, begins oscillating in accordance with the start signal and stops oscillating in accordance with the stop signal; and
    a counter that counts a number of edges of at least one phase signal among the plurality of phase signals and outputs a count signal indicating the number of edges,
    wherein a phase of the oscillator circuit is specified in accordance with a value of each of the plurality of phase signals, and
    wherein the phase at a start time point at which the start signal is input and the phase at a stop time point at which the stop signal is input are referred to as a start phase and a stop phase, respectively,
    the time-to-digital conversion circuit further comprising:
    a phase sampling circuit that samples the value of each of the plurality of phase signals at the stop time point and outputs a stop phase signal indicating the stop phase;
    a start phase signal generating circuit that outputs a start phase signal for specifying the start phase; and
    an output circuit that, based on the count signal, the stop phase signal, and the start phase signal, generates an output signal, the output signal being a digital signal indicating a time period from the start time point to the stop time point.

2. The time-to-digital conversion circuit according to claim 1, wherein the start phase signal generating circuit outputs a pseudo-random signal as the start phase signal, and
    thereby updates the start phase each time the count signal is initialized.

3. The time-to-digital conversion circuit according to claim 1, wherein the start phase signal generating circuit outputs, as the start phase signal, a signal of a value periodically varying in a predetermined pattern, and
    thereby updates the start phase each time the count signal is initialized.

* * * * *